(12) United States Patent
Moon

(10) Patent No.: US 7,964,325 B2
(45) Date of Patent: Jun. 21, 2011

(54) MASK AND METHOD FOR FORMING A SEMICONDUCTOR DEVICE USING THE SAME

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 418 days.

(21) Appl. No.: 12/163,825

(22) Filed: Jun. 27, 2008

(65) Prior Publication Data

US 2009/0108215 A1     Apr. 30, 2009

(30) Foreign Application Priority Data

Oct. 31, 2007  (KR) .......................... 10-2007-0110682

(51) Int. Cl.
*G03F 1/00* (2006.01)
*G03C 5/00* (2006.01)
(52) U.S. Cl. ........................................... 430/5; 430/311
(58) Field of Classification Search ............... 430/5, 311, 430/312, 313, 394; 716/19, 20, 21
See application file for complete search history.

(56) References Cited

U.S. PATENT DOCUMENTS

| 2001/0021490 A1* | 9/2001 | Lee et al. ....................... 430/396 |
| 2006/0134530 A1* | 6/2006 | Park ................................... 430/5 |
| 2008/0026299 A1* | 1/2008 | Chai et al. .......................... 430/5 |

FOREIGN PATENT DOCUMENTS

| JP | 10-055059 | 2/1998 |
| KR | 1020010045488 A | 6/2001 |

* cited by examiner

*Primary Examiner* — Stephen Rosasco
(74) *Attorney, Agent, or Firm* — Kilpatrick Townsend & Stockton LLP

(57) ABSTRACT

A mask is formed with first contact patterns in first columns and second contact patterns in second columns. Each first column is formed between adjacent second columns. The first contact pattern in each first column is aligned with the first contact patterns in the other first columns. The second contact pattern in each second column is aligned with the second contact patterns in the other second columns. The first contact patterns in each first column are not aligned with the second contact patterns in the second columns. Patterning is performed using the mask to secure the size of the contact patterns and to improve a process margin when manufacturing semiconductor devices.

14 Claims, 15 Drawing Sheets

MASK AND METHOD FOR FORMING A SEMICONDUCTOR DEVICE USING THE SAME

CROSS-REFERENCE TO RELATED APPLICATION

Priority is claimed to Korean patent application number 10-2007-0110682, filed on Oct. 31, 2007, which is incorporated by reference in its entirety.

BACKGROUND OF THE INVENTION

The present invention relates to a mask for manufacturing a semiconductor device, and a method of forming a semiconductor device using the same.

As semiconductor devices become more highly integrated, the size of semiconductor devices decreases. In particular, in the case of a flash memory, many more devices have to be integrated on a semiconductor substrate to increase the storage capacity of memory. Accordingly, the density of semiconductor devices has increased, and the configuration of the circuit has become more complex.

FIG. 1 is a plane view showing a conventional semiconductor device including drain contacts 40 of a flash memory 10.

The drain contacts 40 are very densely arranged between a first gate 20 that is a drain selection line and a second gate 30 that is a source selection line corresponding to the drain selection line at an edge of a mat region 15.

FIG. 2 is an enlarged view of a drain contact portion ⓐ of FIG. 1.

As semiconductor devices have become more highly integrated, the gap 'D' and the pitch 'P' between adjacent drain contacts 40 has decreased. Thus, the possibility that a bridge error may occur between the drain contacts 40 has increased. Furthermore, the distance 'G' between the drain contact 40 and each gate 20, 30 is larger than the gap 'D' between the drain contacts 40.

FIG. 3 is a drawing showing a conventional semiconductor device in which the drain contact formation process is completed.

Referring to FIG. 3, the size ⓨ of the drain contact and the gap ⓧ between the drain contacts are decreased in a highly integrated device. Thus, the possibility that a bridge error may occur is highest at the region where the distance between adjacent drain contacts is the smallest (i.e., the center region).

FIG. 4 is a drawing showing a conventional pattern which is formed in a lithography mask.

Referring to FIG. 4, a pattern 60 defining a drain contact region on a mask 50 is linearly arranged. When the patterns 60 are arranged linearly, like the simulation result of FIG. 3, the gap between the drain contacts which is formed by the pattern 60 becomes narrower, thereby increasing the likelihood of a bridge error.

FIG. 5 is a drawing showing the region in which the intensity of radiation of incident light is concentrated in the lithography process. FIG. 6 is a drawing showing the result of a simulation.

When the exposure energy passes through the mask 50, the intensity of radiation is concentrated on a central area 70 of the pattern 60 defining the drain contact region.

Accordingly, if the regions in which the intensity of radiation is most concentrated are adjacent to each other, the interval between the central areas may also be exposed to light due to the mutual operation of the incident light. In this case, the drain contact can be bridged between the central areas in a subsequent process.

FIGS. 7a to 7e are drawings showing the formation of a drain contact according to DOF (Depth of Focus).

FIG. 7a shows the formation of a drain contact which is normally formed in a best focus. FIG. 7b shows the drain contact when a + defocus is generated. FIG. 7c shows the drain contact when a ++ defocus is generated. FIG. 7d shows the drain contact when a +++ defocus is generated.

In case of a +++ defocus is generated while the drain contact is arranged linearly, the size of the drain contact rapidly decreases.

Furthermore, FIG. 7e shows that a ++++ defocus is generated. In this case, the drain contact is not formed.

That is, when the drain contact pattern is arranged linearly, the process margin is reduced.

BRIEF SUMMARY OF THE INVENTION

Embodiments of the present invention are directed to improve the pattern structure of a lithography mask to improve the process margin for the formation of a semiconductor device.

According to an embodiment of the present invention, a mask for manufacturing a semiconductor device includes first contact patterns formed in first columns and second contact patterns formed in second column. Each first column is formed between adjacent second columns. The first contact pattern in each first column is aligned with the first contact patterns in the other first columns. The second contact patterns in each second column are aligned with the second contact patterns in the other second columns. The first contact pattern in each first column is not aligned with the second contact patterns in the second columns.

Each of the first and second contact patterns forms a drain contact. The drain contact is formed between a drain selection line and a source selection line of a flash gate. The first contact patterns are formed to be closer to one of the drain selection line and the source selection line at one end thereof, and the second contact patterns are formed to closer to the other of the drain selection line and the source selection line at another end thereof. Each first contact pattern comprises a plurality of aligned first scattering space patterns and each second contact pattern comprises a plurality of aligned second scattering space patterns. The first scattering space patterns are not aligned with the second scattering space patterns. A gap between adjacent first scattering space patterns in each first contact pattern is smaller than a minimum line width for forming a pattern by a lithography process.

According to an embodiment of the present invention, a method of manufacturing a semiconductor device includes forming an insulating layer over a semiconductor substrate; forming a photoresist layer on the insulating layer; and forming a photoresist pattern by exposing the photoresist layer to light using a mask. The mask includes first contact patterns formed in first columns and second contact patterns formed in second column. Each first column is formed between adjacent second columns. The first contact pattern in each first column is aligned with the first contact patterns in the other first columns. The second contact patterns in each second column are aligned with the second contact patterns in the other second columns. The first contact pattern in each first column is not aligned with the second contact patterns in the second columns.

A mask for manufacturing a semiconductor device includes first contact patterns formed in first columns and second contact patterns formed in second columns. Each first column is formed between adjacent second columns. The first contact patterns in each first column are aligned with the first contact patterns in the other first columns. The second contact patterns in each second column are aligned with the second contact patterns in the other second columns. The first contact patterns in each first column are not aligned with the second contact patterns in the second columns.

DESCRIPTION OF EMBODIMENTS

Figure 1:
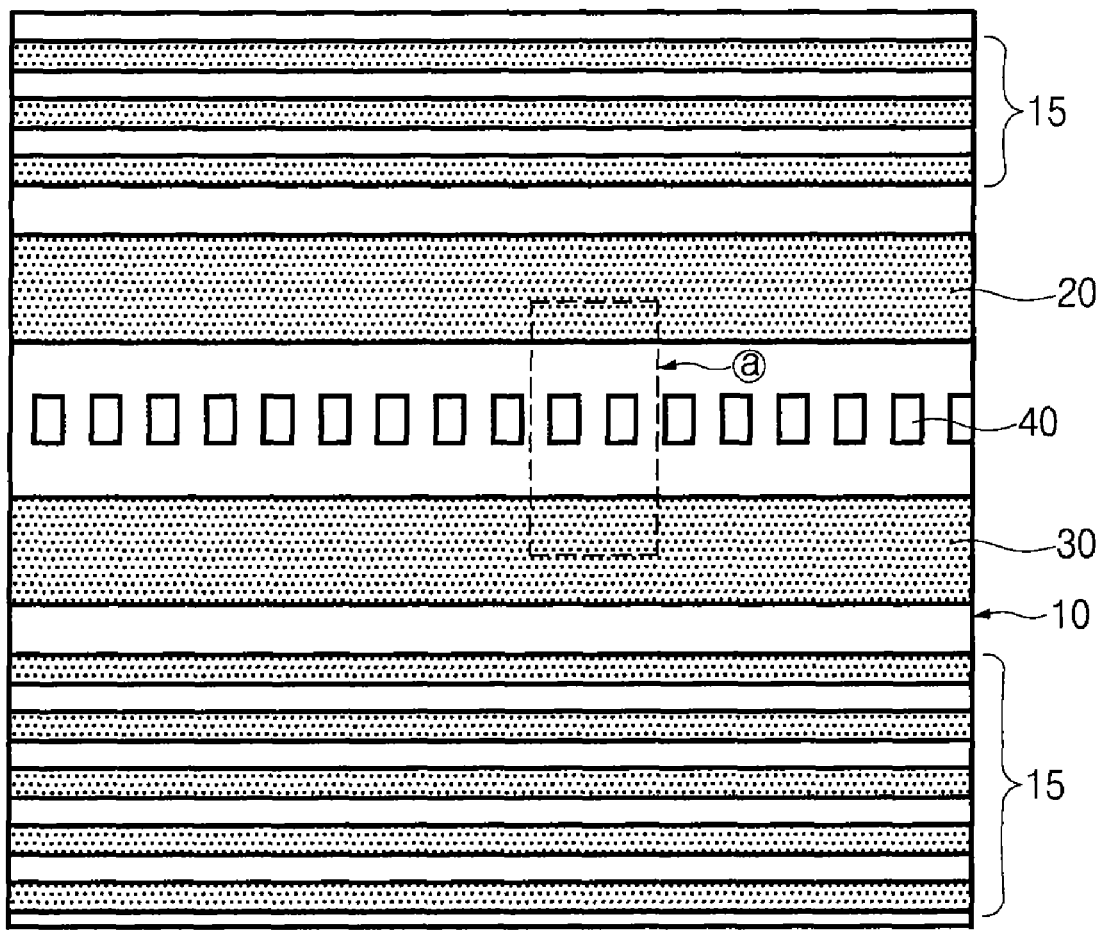
FIG. 1 is a plane view showing a conventional semiconductor device.
Figure 2:
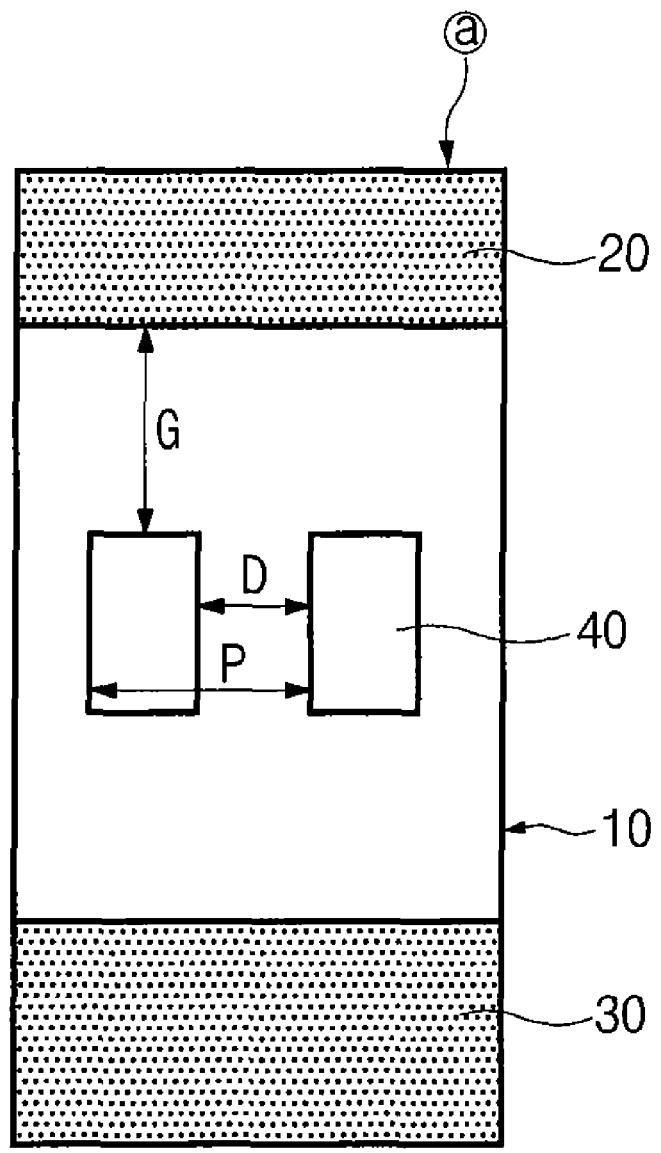
FIG. 2 is a plane view of an enlarged drain contact portion of FIG. 1.
Figure 3:
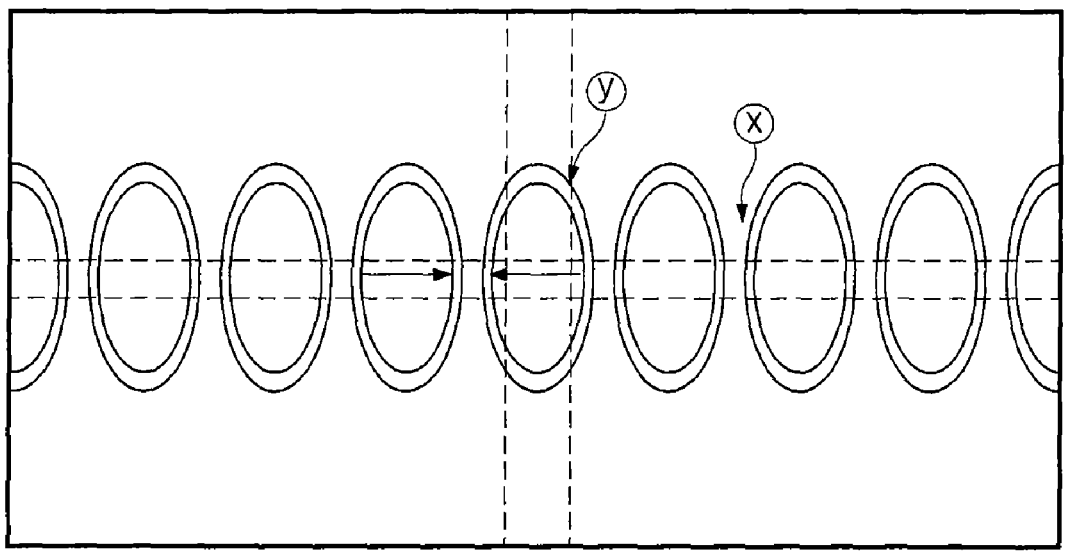
FIG. 3 is a plane view showing a conventional semiconductor device.
Figure 4:
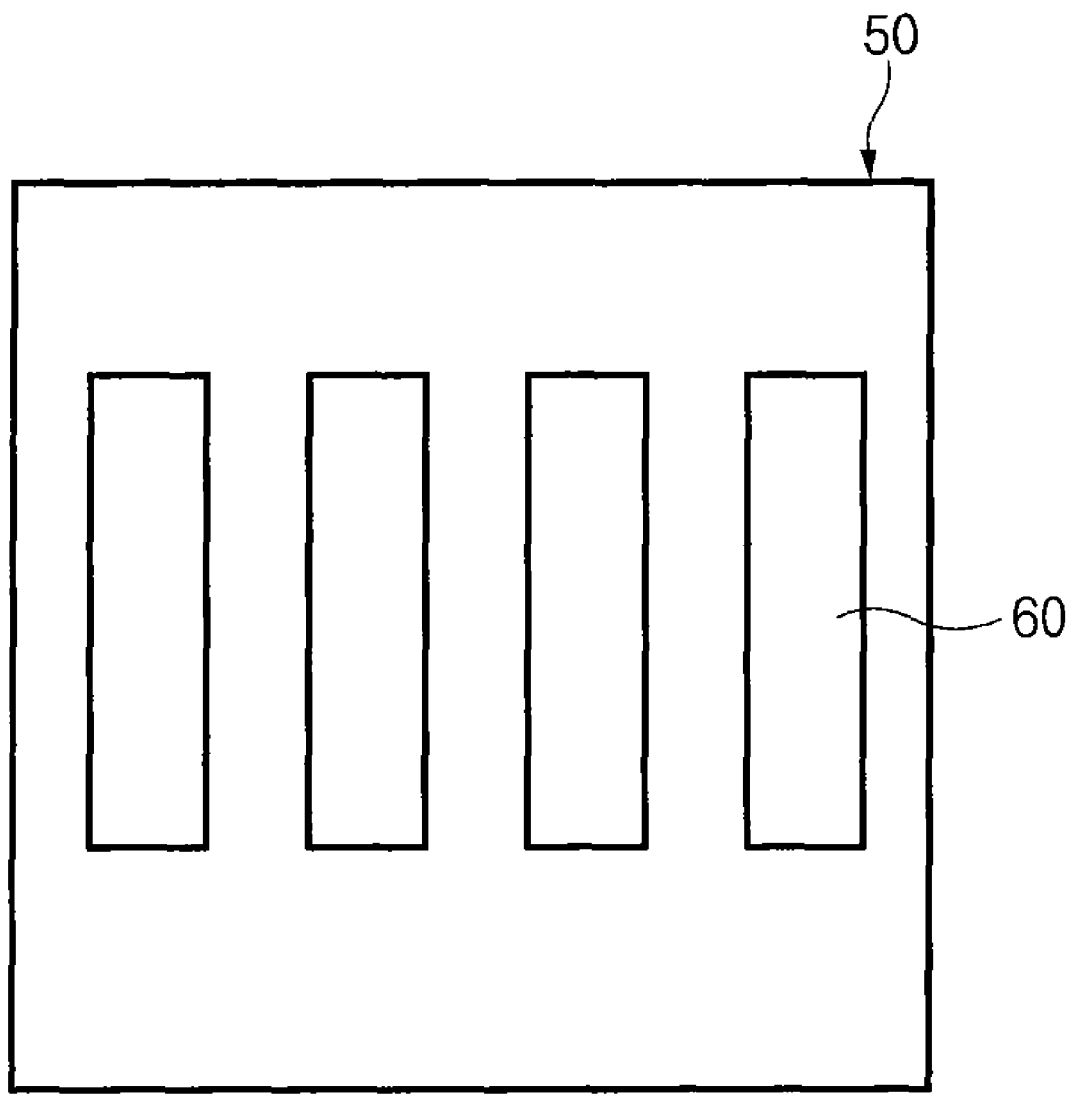
FIG. 4 is a drawing showing a conventional pattern formed in a lithography mask.
Figure 5:
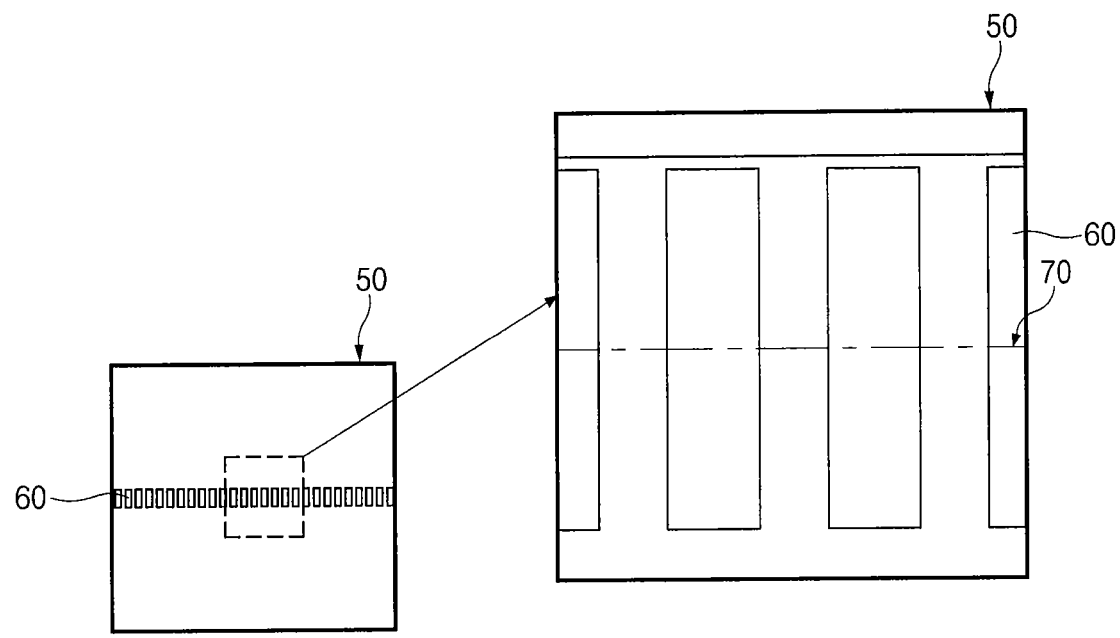
FIG. 5 is a drawing showing a region in which the intensity of radiation of incident light is concentrated in the lithography process.
Figure 6:
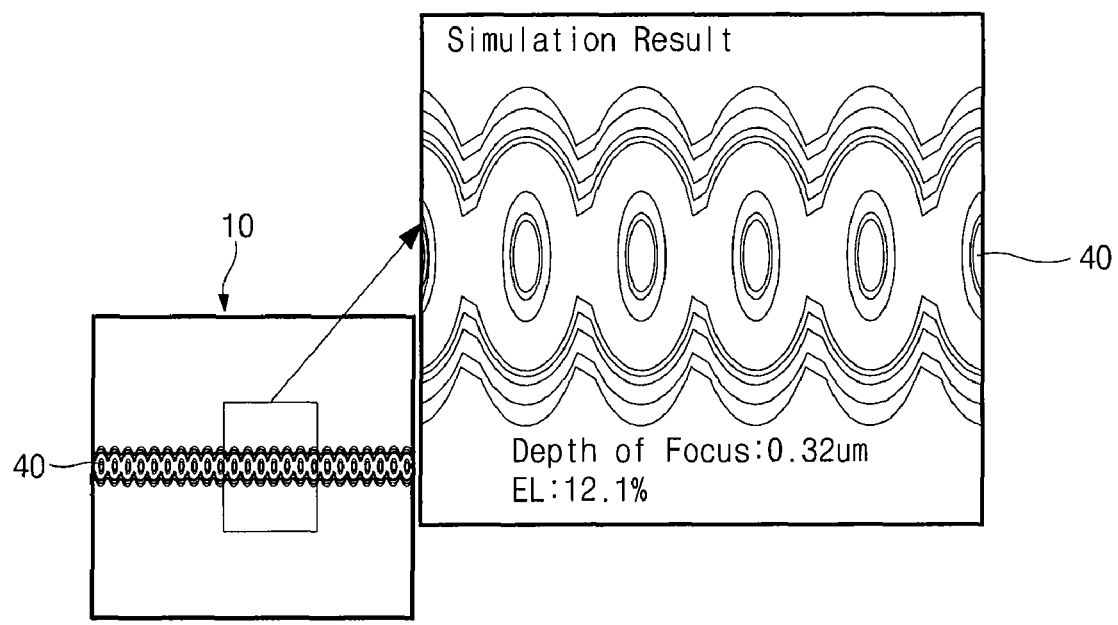
FIG. 6 is a drawing showing a simulation result using a conventional lithography mask.
Figure 7A:
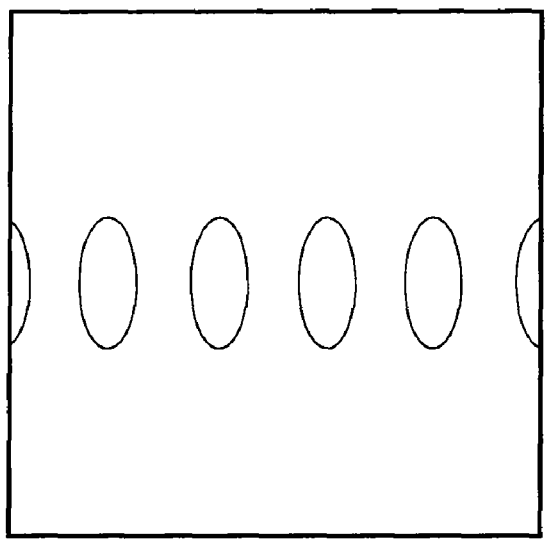
FIGS. 7a to 7e are drawings showing the formation of a drain contact according to DOF when using the mask of FIG. 6.
Figure 7B:
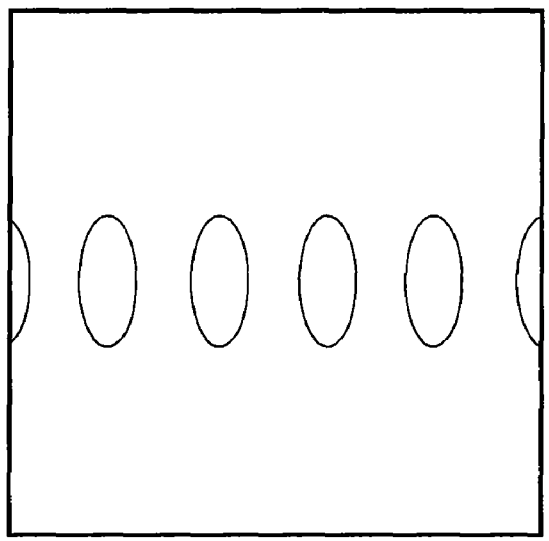
Figure 7C:
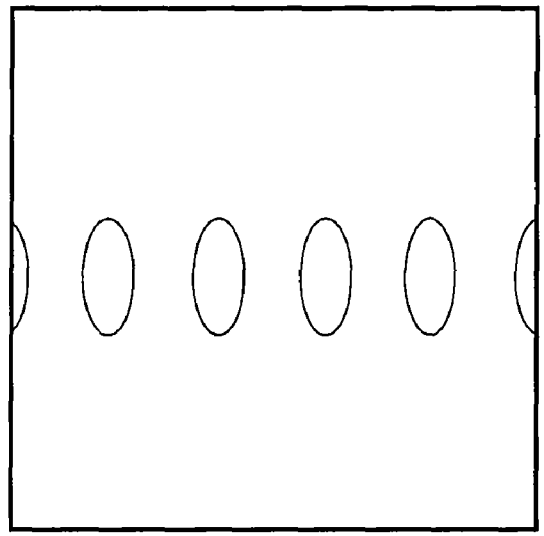
Figure 7D:
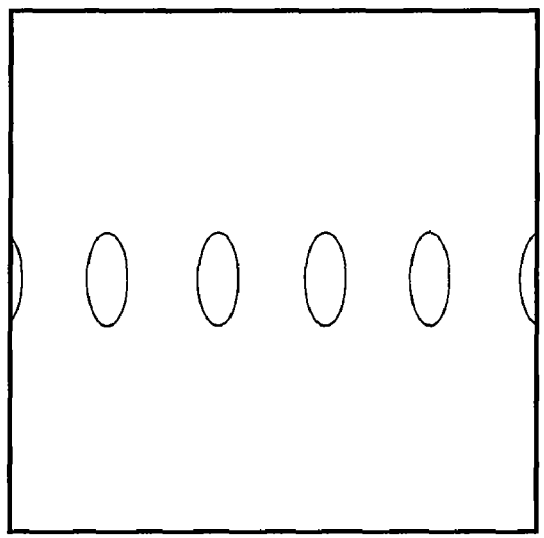
Figure 7E:
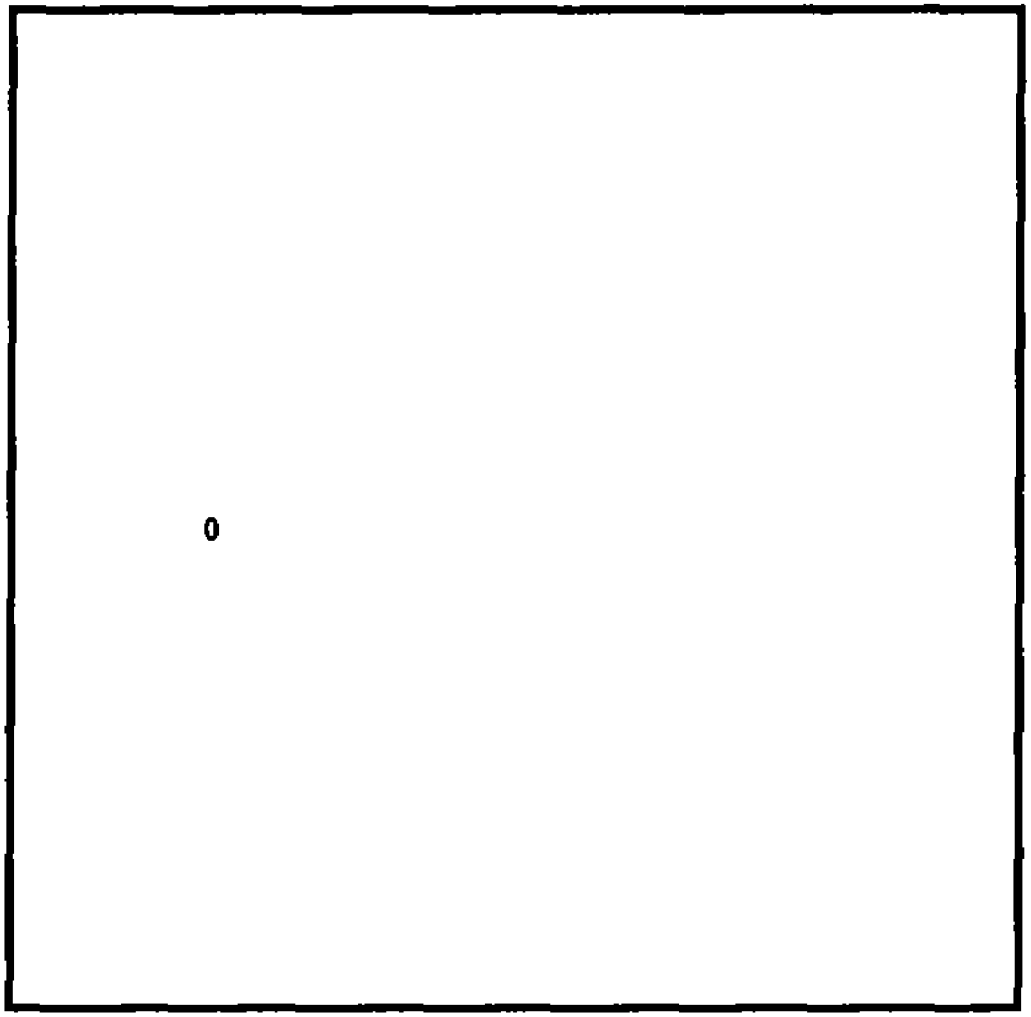
Figure 8:
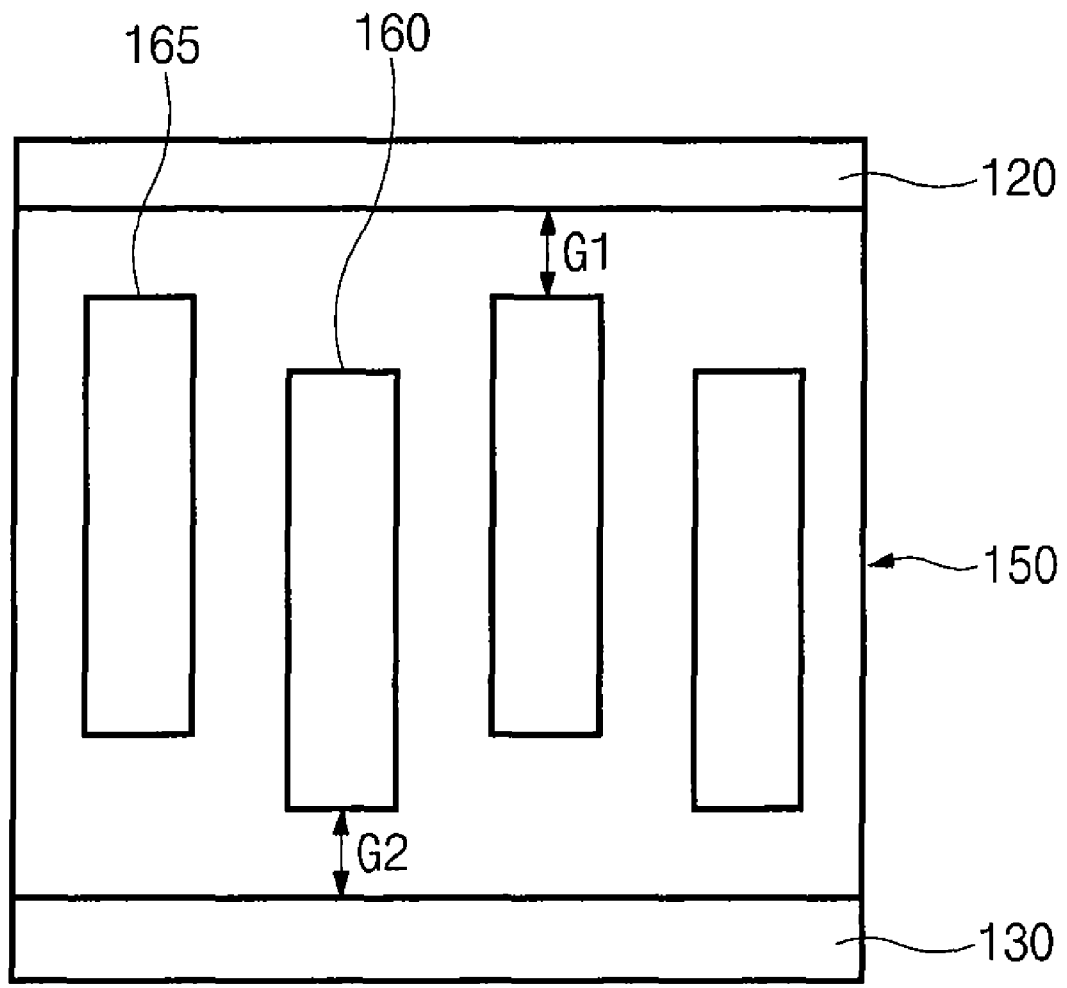
FIG. 8 is a drawing showing a pattern which is formed in a lithography mask according to the present invention.

FIG. 8 is a drawing showing a pattern which is formed in a lithography mask according to the present invention.

A lithography mask 150 of the present invention includes first and second contact patterns 160, 165 which are defined between a first line pattern 120 and a second line pattern 130. The first line pattern 120 and the second line pattern 130 extend along opposite edges of the mask 150. The first and second contact patterns 160, 165 form a contact pattern pair such that the first contact pattern 160 is positioned closer to the second line pattern 130 than the second contact pattern 165 at one end thereof, and the first contact pattern 160 is positioned further away from the first line pattern 120 than the second contact pattern 165 at an opposite end thereof. Thus, the central area of each first contact pattern 160 is closer to the second line pattern 130 and the central area of each second contact pattern 165 is closer to the first line pattern 120.

In addition, the gap G1 between the second contact pattern 165 and the first line pattern 120, and the gap G2 between the first contact pattern 160 and the second line pattern 130 can be controlled within the permitted range of a lithography apparatus.

Due to the arrangement of the first and second contact patterns 160, 165, the central areas of the contact patterns 160, 165 in which the intensity of radiation of incident light is concentrated in the lithography process are not aligned. Thus, the process margin for forming the contact patterns 160, 165 is increased.

In addition, in order to increase the process margin, the contact patterns 160, 165 can be formed as scattering space patterns rather than the bar-shaped patterns shown in FIG. 8.

Figure 9:
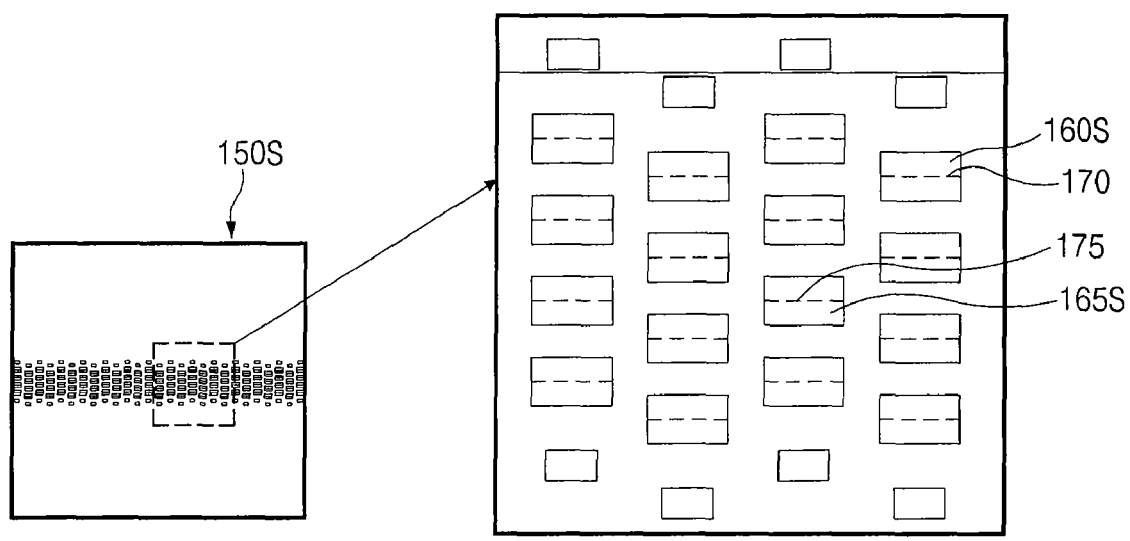
FIG. 9 is a drawing showing a pattern including scattering space patterns.

FIG. 9 is a drawing showing a pattern including scattering space patterns.

Referring to FIG. 9, a scattering space mask 150S includes first scattering space patterns 160S and second scattering space patterns 165S. The first scattering space patterns 160S are vertically aligned in columns between opposite edges of the mask 150S, and the second scattering space patterns 165S are also vertically aligned in columns between opposite edges of the mask 150S. Each column of the first scattering space patterns 160S is formed between adjacent columns of the second scattering space patterns 165S. Furthermore, each individual first scattering space pattern 160S is aligned with a first scattering space pattern 160S in another column, and each individual second scattering space pattern 165S is aligned with a second scattering space pattern 165S in another column. However, each individual first scattering space pattern 160S is not aligned with a corresponding second scattering space pattern 165S in an adjacent column. Thus, a central area 170 of each first scattering space pattern 160S is not aligned with a central area 175 of a corresponding second scattering space pattern 165S. In one embodiment, a gap between adjacent first scattering space patterns 160S in the same column, and a gap between adjacent second scattering space patterns 165S in the same column are each formed to be smaller than a minimum line width for forming a pattern by a lithography process.

Since the intensity of radiation is concentrated in the central areas 170, 175 of each scattering space pattern 160S, 165S in the lithography process, when a center of the first scattering space pattern 160S and a center of an adjacent second scattering space pattern 165S are aligned, a bridge error may occur. Accordingly, as shown in FIG. 9, scattering space patterns 160S, 165S in adjacent columns are not aligned.

Figure 10:
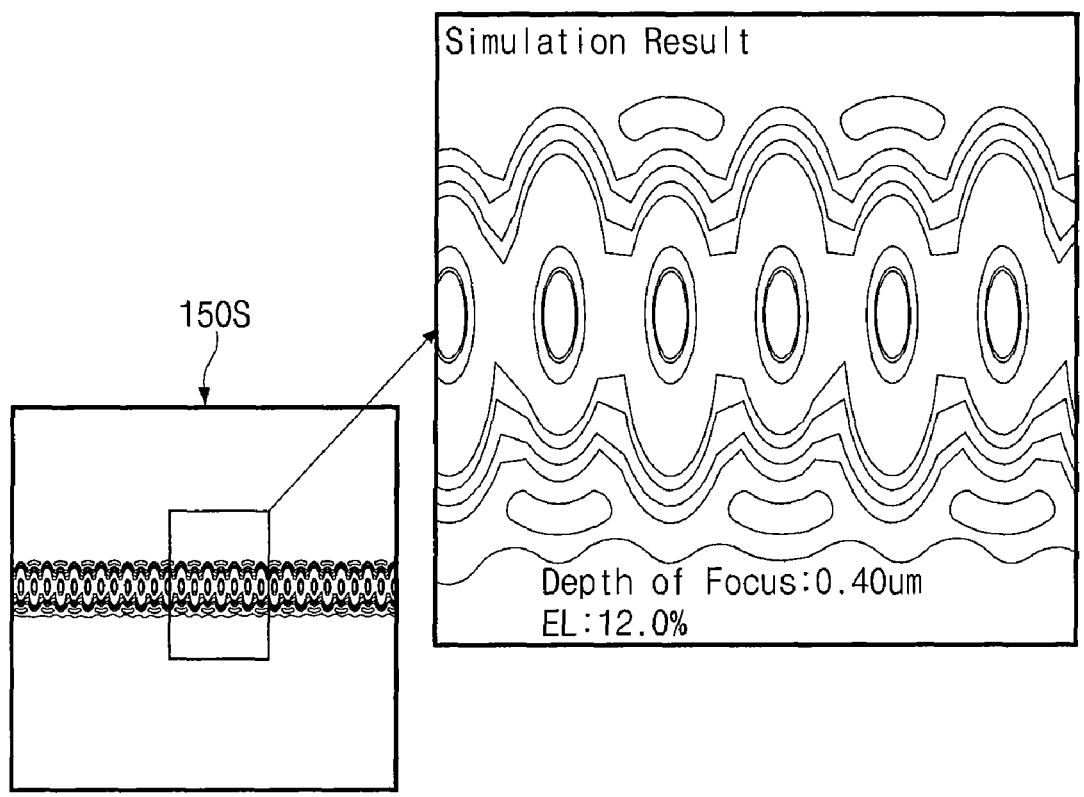
FIG. 10 is a drawing showing the simulation result using a lithography mask according to the present invention.

FIG. 10 is a drawing showing a simulation result using a lithography mask according to the present invention. A lithography process condition is set such that the Exposure Latitude (EL) can be controlled to be 12.0% with DOF 0.40 μm.

Adjacent patterns are formed to be misaligned such that the center of each pattern is not aligned with the center of a corresponding patterns in an adjacent column. Thus, the central areas of the misaligned adjacent patterns diminish the mutual effect of light which is concentrated in the central part of the pattern.

As described, in the present invention, the likelihood that a bridge error occurs becomes much lower than the case where the patterns are linearly arranged. Therefore, the size of the drain contact can be formed to be relatively larger, thereby forming the drain contact more stably.

FIGS. 11a to 11e are drawings showing the formation of a drain contact according to DOF when using the mask of the present invention.

A first line pattern 120 and a second line pattern 130 are formed on a semiconductor substrate.

When the semiconductor device is a flash memory, the first line pattern 120 is a pattern for forming a drain selection line of flash gate, and the second line pattern 130 is a pattern for forming a source selection line.

An interlayer dielectric layer (not shown) and a photoresist layer (not shown) are sequentially formed in the region between the first line pattern 120 and the second line pattern 130.

Using the mask shown in FIG. 8 or FIG. 9, the photoresist layer is exposed to light and developed so that a photoresist pattern (not shown) is formed. The interlayer dielectric layer is selectively etched using the photoresist pattern as an etch mask to form the drain contact holes.

In the lithography process for forming the photoresist pattern, the results of FIGS. 11a to 11e are obtained according to DOF.

Figure 11A:
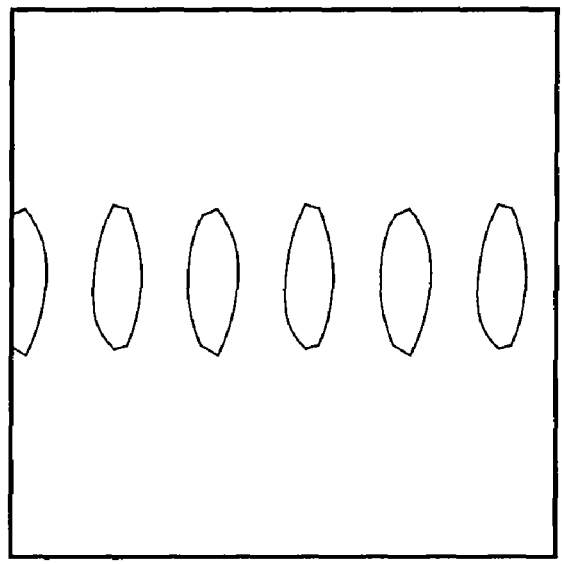
FIGS. 11a to 11e are drawings showing the formation of a drain contact according to DOF when using the mask of the present invention.
Figure 11B:
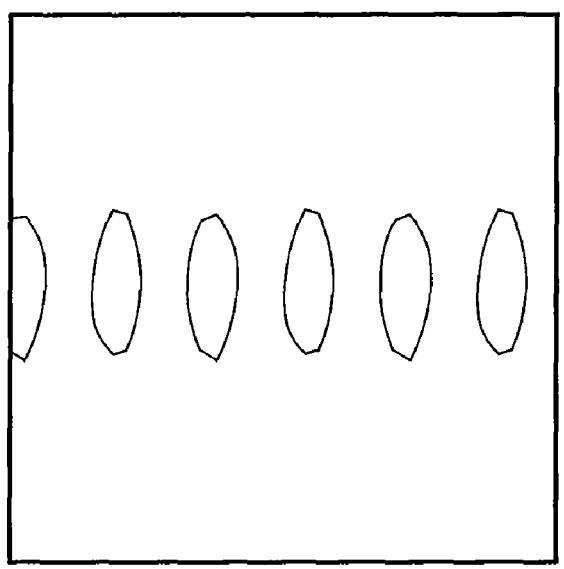
Figure 11C:
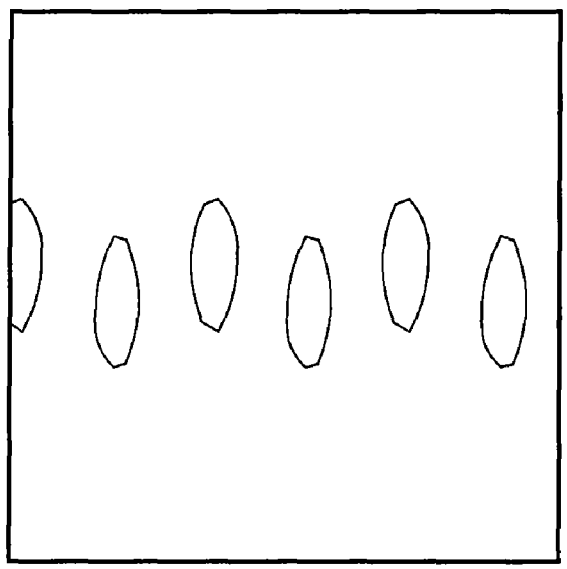
Figure 11D:
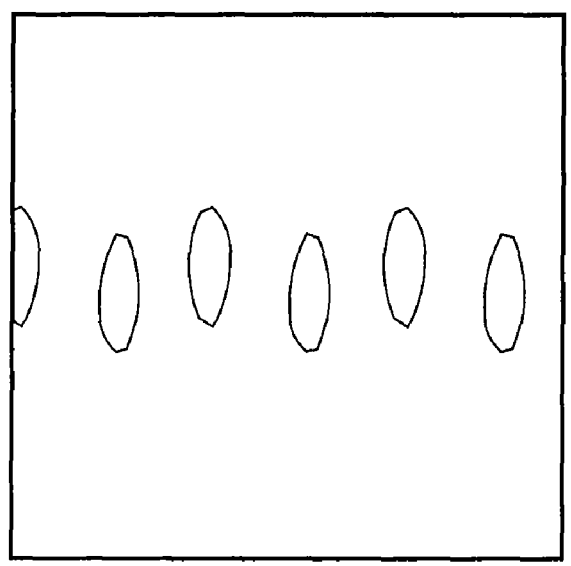
Figure 11E:
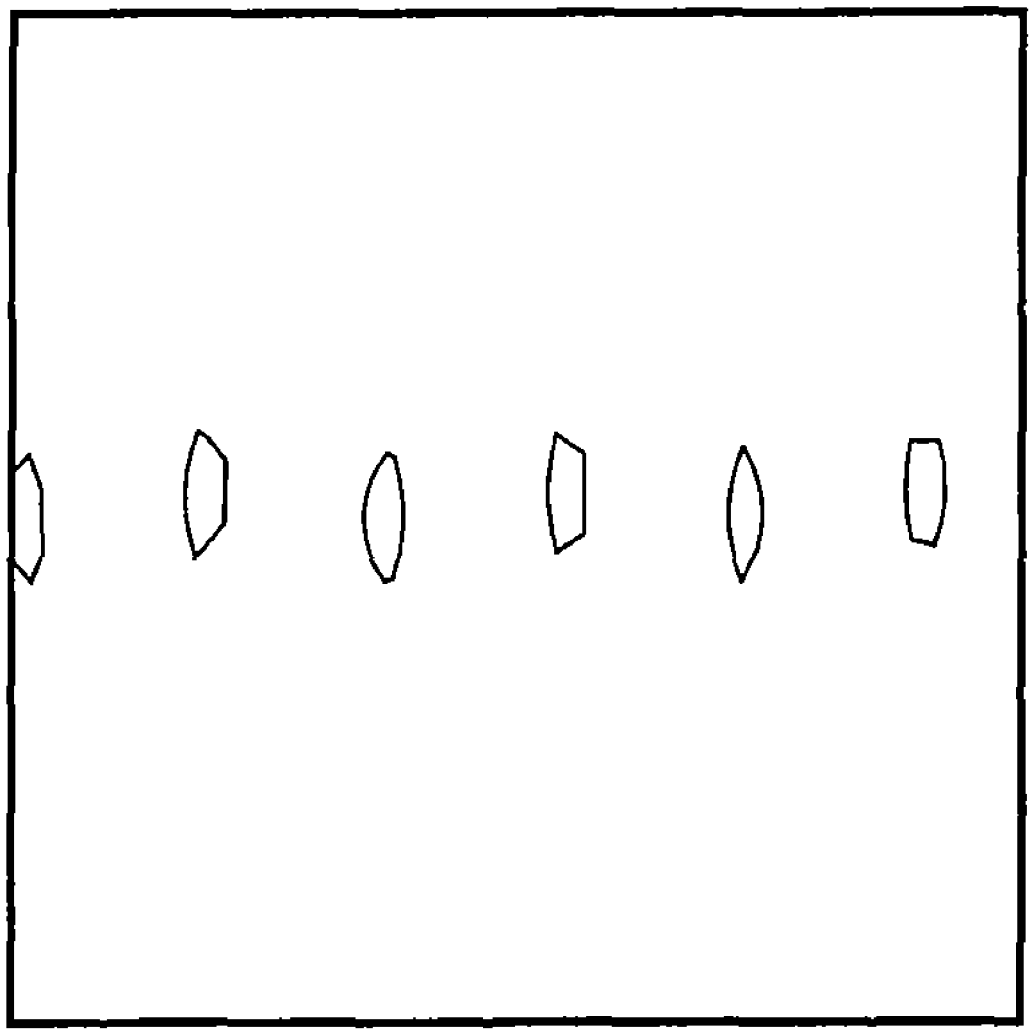

FIG. 11a shows the formation of drain contact which is formed in a best focus. FIGS. 11b to 11e show the drain contact formed using a + defocus, a ++ defocus, a +++ defocus and, a ++++ defocus, respectively.

As can be seen when comparing FIGS. 11a to 11e with FIGS. 7a to 7e, the process capability is improved using a mask which is defined with adjacent contact patterns which are misaligned.

In the above embodiments, the memory device of the present invention is a flash memory. However, it is not so limited. That is, the present invention can be applied to forming a mask pattern which is used for manufacturing different types of semiconductor devices. The present invention can also be applied when a dense contact or a dummy contact is formed. In addition, the lithography process can be applied to cases where I-line, KrF, ArF, EUV or F2 are used.

The present invention can improve the lithography process margin by forming a lithography mask such that the adjacent patterns are misaligned. Accordingly, the present invention can improve the critical dimension (CD) uniformity of the semiconductor device, reduce bridge error, and increase the DOF margin, thereby increasing the yield of the semiconductor device and improving reliability.

It will be apparent to those skilled in the art that various modifications and variations can be made in the present invention without departing from the spirit of the invention. Thus, it is intended that the present invention cover the modifications and variations of this invention provided they come within the scope of the appended claims and their equivalents.

What is claimed is:

1. A mask for manufacturing a semiconductor device, comprising first contact patterns formed in first columns and second contact patterns formed in second columns, wherein each first column is formed between adjacent second columns,
   wherein the first contact pattern in each first column is aligned with the first contact patterns in the other first columns,
   wherein the second contact pattern in each second column is aligned with the second contact patterns in the other second columns,
   wherein the first contact pattern in each first column is not aligned with the second contact patterns in the second columns,
   wherein each first contact pattern comprises a plurality of aligned first scattering space patterns and each second contact pattern comprises a plurality of aligned second scattering space patterns, and
   a gap between adjacent scattering space patterns in each first and second contact pattern is smaller than a minimum line width for forming a pattern by a lithography process.

2. The mask for manufacturing a semiconductor device of claim 1, wherein each of the first and second contact patterns forms a drain contact.

3. The mask for manufacturing a semiconductor device of claim 2, wherein the drain contact is formed between a drain selection line and a source selection line of a flash gate.

4. The mask for manufacturing a semiconductor device of claim 3, wherein the first contact patterns are formed to be closer to one of the drain selection line and the source selection line at one end thereof, and the second contact patterns are formed to closer to the other of the drain selection line and the source selection line at an opposite end thereof.

5. The mask for manufacturing a semiconductor device of claim 1, wherein the first scattering space patterns are not aligned with the second scattering space patterns.

6. A method of manufacturing a semiconductor device, the method comprising:
   forming an insulating layer over a semiconductor substrate;
   forming a photoresist layer over the insulating layer; and
   forming a photoresist pattern by exposing the photoresist layer to light using a mask, the mask comprising first contact patterns formed in first columns and second contact patterns formed in second columns,
   wherein each first column is formed between adjacent second columns,
   wherein the first contact pattern in each first column is aligned with the first contact patterns in the other first columns,
   wherein the second contact pattern in each second column is aligned with the second contact patterns in the other second columns,
   wherein the first contact pattern in each first column is not aligned with the second contact patterns in the second columns,
   wherein each first contact pattern comprises a plurality of aligned first scattering space patterns and each second contact pattern comprises a plurality of aligned second scattering space patterns, and
   a gap between adjacent scattering space patterns in each first and second contact pattern is smaller than a minimum line width for forming a pattern by a lithography process.

7. The method of claim 6, wherein each of the first and second contact patterns forms a drain contact.

8. The method of claim 7, wherein the drain contact is formed between a drain selection line and a source selection line of a flash gate.

9. The method of claim 8, wherein the first contact patterns are formed to be closer to one of the drain selection line and the source selection line at one end thereof, and the second contact patterns are formed to be closer to the other of the drain selection line and the source selection line at an opposite end thereof.

10. The method of claim 6, wherein the first scattering space patterns are not aligned with the second scattering space patterns.

11. A mask for manufacturing a semiconductor device, comprising first contact patterns formed in first columns and second contact patterns formed in second columns,
   wherein each first column is formed between adjacent second columns,
   wherein the first contact patterns in each first column are aligned with the first contact patterns in the other first columns,
   wherein the second contact patterns in each second column are aligned with the second contact patterns in the other second columns,
   wherein the first contact patterns in each first column are not aligned with the second contact patterns in the second columns, and a gap between adjacent contact patterns in each column is smaller that a minimum line width for forming a pattern by a lithography process.

12. The mask for manufacturing a semiconductor device of claim 11, wherein each of the first and second columns forms a drain contact.

13. The mask for manufacturing a semiconductor device of claim 12, wherein the drain contact is formed between a drain selection line and a source selection line of a flash gate.

14. The mask for manufacturing a semiconductor device of claim 13, wherein the first columns are formed to be closer to one of the drain selection line and the source selection line at one end thereof, and the second columns are formed to closer to the other of the drain selection line and the source selection line at an opposite end thereof.

* * * * *